(12) United States Patent
Jerye

(10) Patent No.: US 7,917,141 B2
(45) Date of Patent: Mar. 29, 2011

(54) METHOD FOR TUNING A SYSTEM TO A PLURALITY OF SERVICE SIGNALS

(75) Inventor: Matthias Jerye, Fellbach (DE)

(73) Assignee: Sony Deutschland GmbH, Cologne (DE)

( * ) Notice: Subject to any disclaimer, the term of this patent is extended or adjusted under 35 U.S.C. 154(b) by 908 days.

(21) Appl. No.: 11/815,153

(22) PCT Filed: Feb. 1, 2006

(86) PCT No.: PCT/EP2006/000888
§ 371 (c)(1),
(2), (4) Date: Jul. 31, 2007

(87) PCT Pub. No.: WO2006/087104
PCT Pub. Date: Aug. 24, 2006

(65) Prior Publication Data
US 2008/0102769 A1    May 1, 2008

(30) Foreign Application Priority Data
Feb. 21, 2005    (EP) ..................... 05003684

(51) Int. Cl.
*H04Q 7/20* (2006.01)

(52) U.S. Cl. ............... 455/434; 455/161.1; 370/328
(58) Field of Classification Search ........... 455/160.1, 455/161.1, 434; 370/328
See application file for complete search history.

(56) References Cited

U.S. PATENT DOCUMENTS

| | | | |
|---|---|---|---|
| 5,812,937 A * | 9/1998 | Takahisa et al. | 455/66.1 |
| 6,961,566 B2 * | 11/2005 | Ida et al. | 455/434 |
| 7,197,291 B2 * | 3/2007 | Mach et al. | 455/303 |
| 7,420,946 B2 * | 9/2008 | Kim et al. | 370/335 |
| 2003/0232631 A1 * | 12/2003 | Ohmori | 455/552.1 |

FOREIGN PATENT DOCUMENTS
JP   2004023128   1/2004
* cited by examiner

*Primary Examiner* — Nhan Le
(74) *Attorney, Agent, or Firm* — Oblon, Spivak, McClelland, Maier & Neustadt, L.L.P.

(57) ABSTRACT

A method for tuning a system to a plurality of service signals. The method uses a first and a second tuning process. The first tuning process is adapted and performed to search and find carrier signals of potential service signals and to determine frequencies of potential services corresponding to the service signals. The second tuning processing is adapted and used to register to the system the services corresponding to the service signals based on the determined frequencies.

14 Claims, 3 Drawing Sheets

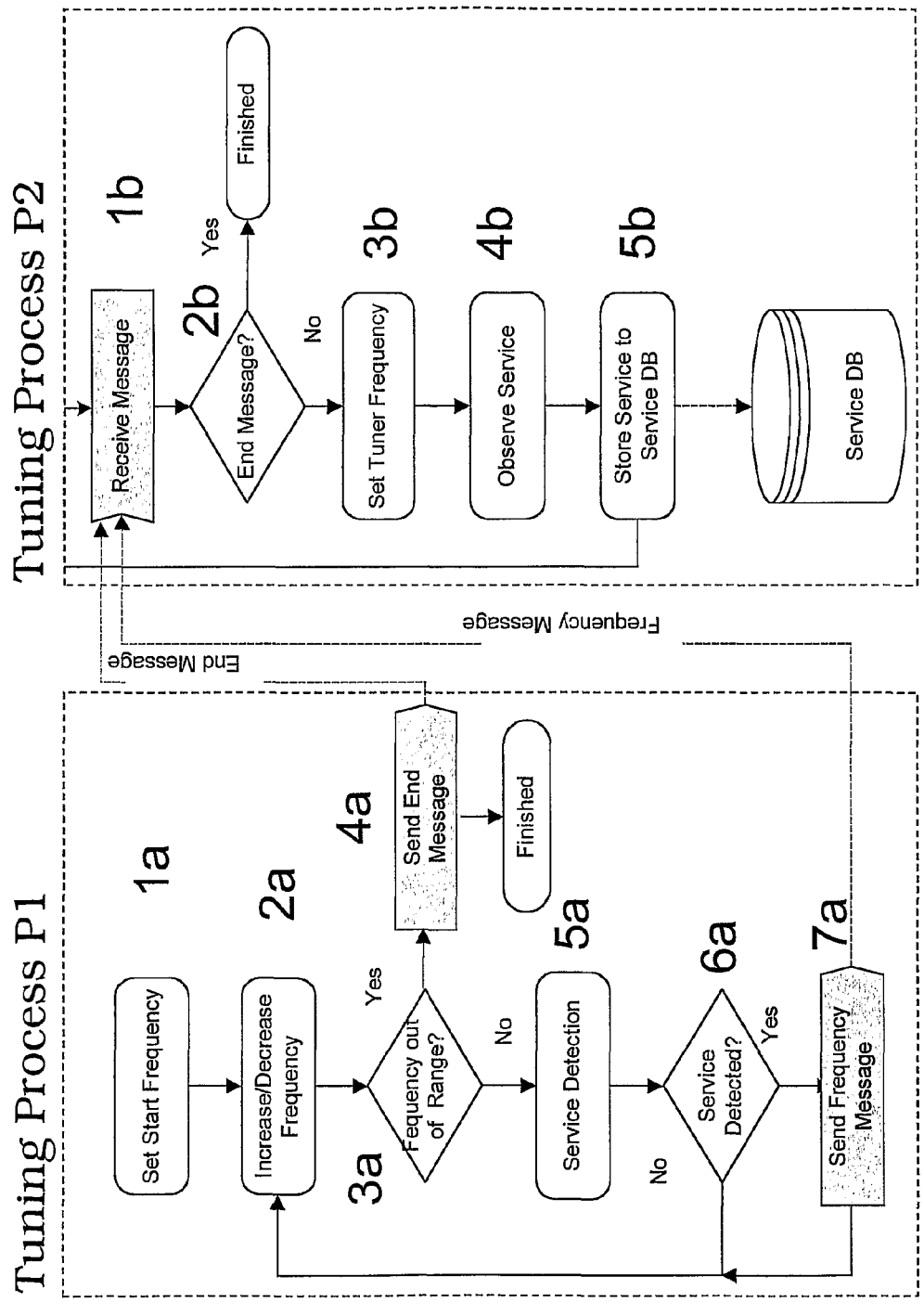
Fig. 2 - Advanced Tuning Process

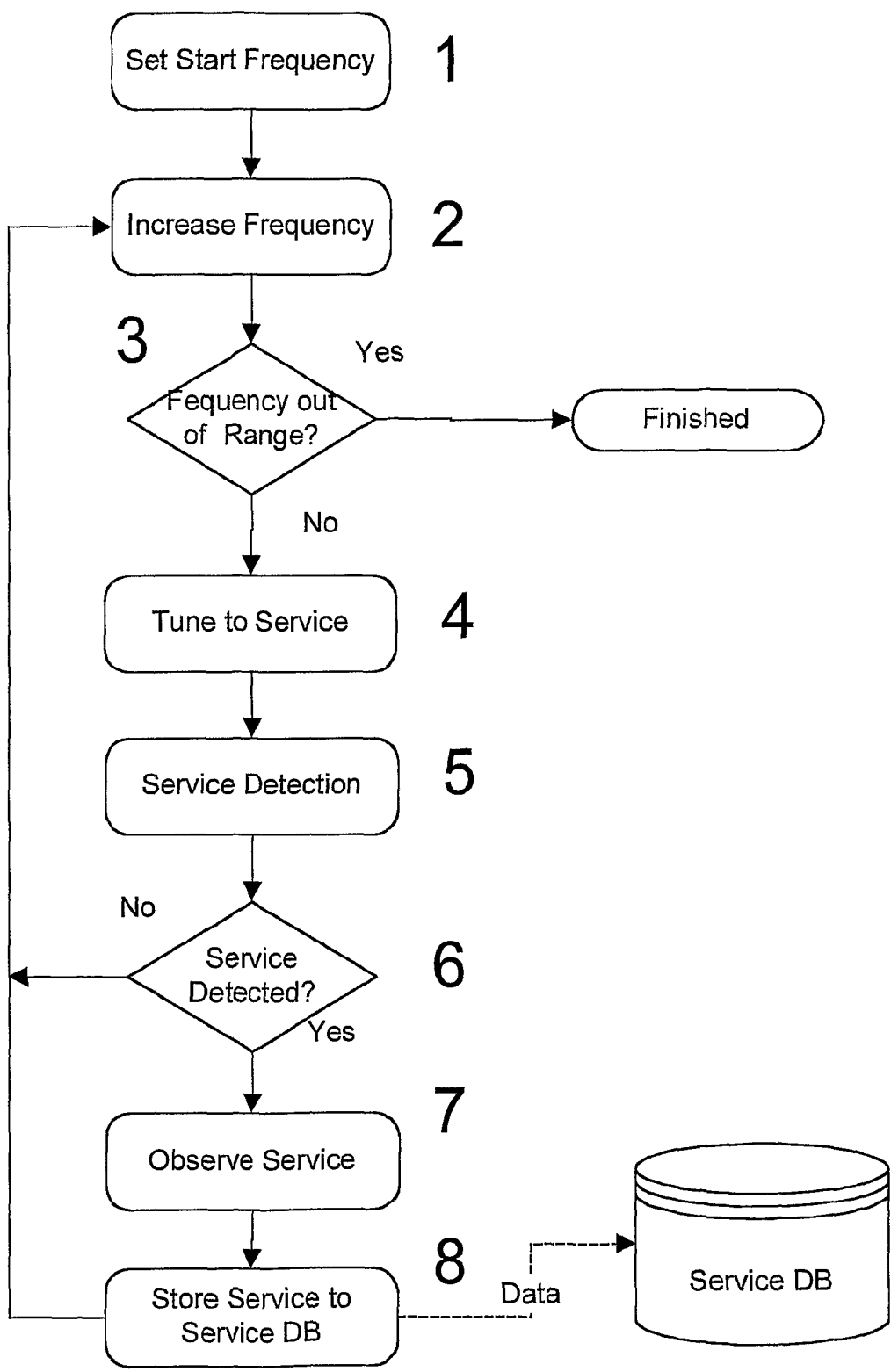
Fig. 3 - Conventional Tuning Process

METHOD FOR TUNING A SYSTEM TO A PLURALITY OF SERVICE SIGNALS

The present invention relates to a method for tuning a system. More particular, the present invention relates to a method for tuning a system to a plurality of service signals, which correspond to a according plurality of potential services. The present invention more particular relates to a fast tuning method or tuning algorithm.

Nowadays the exchange of data between different customer devices or the like becomes more and more important. The exchange of data is realized wireless, via cable or by any other means. Generally, different channels for communicating data between different customer devices are possible and they are often simultaneously involved. For establishing a communication channel it is necessary for a potential receiving device to tune to the different channels in order to get the information which is necessary to build up a valid communication between a sending device and a receiving device. Establishing such a communication channel is realized at least in part by a so called tuning method or tuning process.

However, known methods or processes of tuning a system to a plurality of service signals which might correspond to possible services is rather time consuming as different actions are necessary in order to detect the service signals and to analyze the same with respect to certain technical criteria for establishing a communication channel between a transmitting device and a receiving device.

It is an object underlying the present invention to provide a method for tuning a system to a plurality of service signals which might correspond to potential services which can realize the tuning operation with a reduced tuning time but at the same time in a comparable reliable manner.

The present invention proposes a method for tuning a system of devices to a plurality of service signals of an according plurality of services wherein a first and a second tuning process are used and performed, wherein said first tuning process is adapted and performed in order to search for and find carrier signals of potential service signals and to determine frequencies of said potential service signals and wherein said second tuning process is adapted and performed in order to register said system to said services corresponding to said service signals based on said determined frequencies.

It is therefore a key idea of the present invention to split up the whole tuning operation into a first tuning process and into a second tuning process which carry out operations which are more or less independent from each other in the sense that they can be carried out based on independent operation steps and/or by independent technical means. The first tuning process is designed in order to search for and find carrier signals of possible service signals and the respective frequencies thereof and to communicate these frequencies to the second tuning process which in turn is designed in order to carry out a deeper analysis of the properties of the service corresponding to the receivable service signals in order to characterize the underlying services for a later evaluation or reception. As these first and second tuning processes are more or less independent from each other—of course besides the fact that the carrier frequencies have to be found and communicated before the second communicating process can be started—there is a respective tuning means and the processes itself can be designed more or less ad libitum. Therefore a flexible design with a optimized time consumption and/or with a optimized equipment is—in contrast to prior art tuning apparatuses and/or methods—possible.

According to a preferred embodiment of the method for tuning a system of devices to a plurality of service signals of an according plurality of services according to the present invention said first tuning process may be adapted in order to communicate said frequencies of found carrier signals of said potential service signals of said services, in particular directly to said second tuning process.

According to an additional or alternative embodiment of the method for tuning a system of devices to a plurality of service signals of an according plurality of services according to the present invention said second tuning process may be adapted in order to receive said found frequencies of found carrier of potential service signals of said potential services, in particular directly from said first tuning process.

Additionally or alternatively, said first and said second tuning processes or parts thereof may be performed parallely in accordance with an advantageous embodiment of the method for tuning a system of devices to a plurality of service signals of an according plurality of services according to the present invention.

Further, said first and said second tuning processes or parts thereof may alternatively be performed consecutively in accordance with an advantageous embodiment of the method for tuning a system of devices to a plurality of service signals of an according plurality of services according to the present invention.

In this case each single determined frequency of found carrier signals of potential service signals of potential services may be provided to said second tuning process immediately after said respective frequency has been determined in accordance with still another advantageous embodiment of the method for tuning a system of devices to a plurality of service signals of an according plurality of services according to the present invention.

Alternatively, determined frequencies of found carrier signals of potential service signals of potential services may be provided to said second tuning process in a group-wise manner each group consisting of a sub-set of said determined frequencies in accordance with a further advantageous embodiment of the method for tuning a system of devices to a plurality of service signals of an according plurality of services according to the present invention.

Further alternatively, determined frequencies of found carrier signals of potential service signals of potential services may be provided to said second tuning process in its entirety at a given instant of time after the plurality of frequencies has been determined in its entirety in accordance with still a further advantageous embodiment of the method for tuning a system of devices to a plurality of service signals of an according plurality of services according to the present invention.

In accordance with a further additional or alternative embodiment of the method for tuning a system of devices to a plurality of service signals of an according plurality of services according to the present invention said first tuning process may comprise steps of setting a start frequency as a value for a search frequency, increasing the value of the search frequency, detecting for each value of said search frequency a possible service or service signal.

In accordance with still a further embodiment of the method for tuning a system of devices to a plurality of service signals of an according plurality of services according to the present invention said second tuning process may additionally or alternatively comprise steps of receiving a value of a frequency of a service or a service signal, setting for each received value of a frequency an observation frequency to the respective received frequency, observing the respective services or the respective service signal at said observation frequency, extracting information data from said observed service or said observed service signal, storing said information data.

A first tuning device may preferably be used in order to perform said first tuning process. A second tuning device may be used in order to perform said second tuning process.

In this case a first tuning device may be used which comprises a minimal set of technical means for carrying out the first tuning process and a process of communicating with said second tuning device only.

Additionally or alternatively, a second tuning device may be used which comprises a minimal set of technical means for carrying out said second tuning process and a process of communicating with said first tuning device only.

It is a further aspect of the present invention to provide an apparatus, in particular a receiver, which is adapted and arranged and which comprises means for carrying out the inventive method for tuning a system and which in particular comprises ASIC means or application specific integrated circuit means.

Additionally, it is a further aspect of the present invention to provide a computer program product comprising computer program means which is adapted in order to perform and realize a method for tuning a system according to the present invention and the steps thereof when it is executed on a computer or a digital signal processing means.

Further, a computer readable storage medium proposed comprising a computer program product according to the present invention.

These and further aspects of the present invention will be further discussed in the following:

The present invention inter alia relates in particular to a fast tuning method and algorithm.

Devices which can receive signals from air, via cable or via satellite often need to perform an auto tuning process to observe available signals and their characteristics. Often this process takes rather long time. The invention proposes a solution which can cut the time significantly making use of a second tuner with limited functionality.

TV chassis are shipped with 1 tuner or 2 tuners. To keep the software concept simple, an one tuner scan process is used.

The customer will walk through a setup when he/she switch on the product the first time. A slow acting procedure may be the first and permanent impression of the user.

The combination of hardware and software will save time for everyone who presets the product. It is ready earlier.

A method is outlined for a faster algorithm for appliances which have two tuners e.g. of the same type.

Overview

Appliances, which are capable to receive signals from air via cable or satellite, usually provide auto-installation functions to search and store parameters and properties of all available programmes in the particular network. This process normally takes a lot of time, as the found signals have to be analysed each by each before the information can be stored into a service list. The following idea helps to minimise the time for the whole process by making use of a second tuner and signal path, which is available in most of the high end appliances anyway. Hereby the following invention is allowing the second tuning circuit to be much simpler keeping the additional costs for hardware low.

Conventional Auto-Tuning Method

FIG. 3 shows a conventional auto-tuning algorithm. The whole process runs sequential in one task. After the start frequency is chosen in step 1 and increased in step 2, the frequency range will be checked (step 3) and if it is in range the corresponding data is sent to the tuner (step 4). Then a basic criterion is checked (step 6) to judge if a service is available or possible on that frequency. If not, the steps 2, 3, 4, 5 will be repeated whilst increasing the frequency until a carrier is detected. If a carrier has been detected the next step 7 is to explore the signal for advanced information such as network identification or special data broadcast. Once all information is gathered all relevant service data can be stored in a service list.

Optimised Method (Two Tuner Solution)

Looking at the conventional method there are two different tasks, which may take time. The first task is to find a basic signal, which needs altering the tuning frequency continuously until a basic signal condition is detected. The second task, which takes time, is to observe the found signal and extract any information concerning the particular service. The figure below shows the basic idea of the invention, which splits the whole process into two tasks. The first task is searching for basic signals passing the tuning parameters to the second task, which explores the particular services on that frequency and stores the result into a service list.

FIG. 2 shows the advanced auto tuning process in more detail. This solution separates the previous single task job in two independent working tasks. The task of the first tuner is searching for the carriers where the second task is analysing the found signals and storing them. Steps 1a, 2a, 3a, 5a, 6a of this first tuning process T1 are at least in part comparable to that of the conventional method as shown in FIG. 3. However instead of analysing the signal the first tuning process T1 is sending a message containing the frequency details to said second tuning process T2. This is done in step 7a. After this the first tuning process T1 monotonically increases or decreases the frequency and starts looking for the next carrier Cj. This loop is continued for the whole frequency range.

The second tuning process T2 now receives the message, tunes to the referred frequency and starts analysing the signal. The actions taken here are at least comparable to the respective steps 4, 5, 7 of the conventional method, as shown in FIG. 3. If a valid service sj is found all relevant data ID will be stored and the next available message will be processed.

How the tasks are split may strongly depend on the available hardware and the time needed for the different steps, taking into account that the service detection as well as the observation of the service can have several steps in it.

Some examples where such mechanism can be implemented are for analogue and digital TVs, as well as for analogue and digital audio broadcast.

In the following these and further aspects of the present invention will be elucidated in more detail by taking reference to the accompanying and schematical figures based on preferred embodiments of the present invention.

FIG. 2 is a schematical block diagram which elucidates by means of a flow chart details of a further preferred embodiment of the inventive method for tuning a system.

FIG. 3 is a schematical block diagram which elucidates details of a conventional method for tuning a system by means of a flow chart.

In the following functional and structural similar or equivalent elements and structures will be denoted with the same reference symbols. Not in each case of their occurrence a detailed description will be repeated.

FIG. 1 is a schematical block diagram which elucidates some basic aspects of the inventive method for tuning a system 10 and for a tuning apparatus and a system 10 in which the inventive method is carried out.

Figure 1:
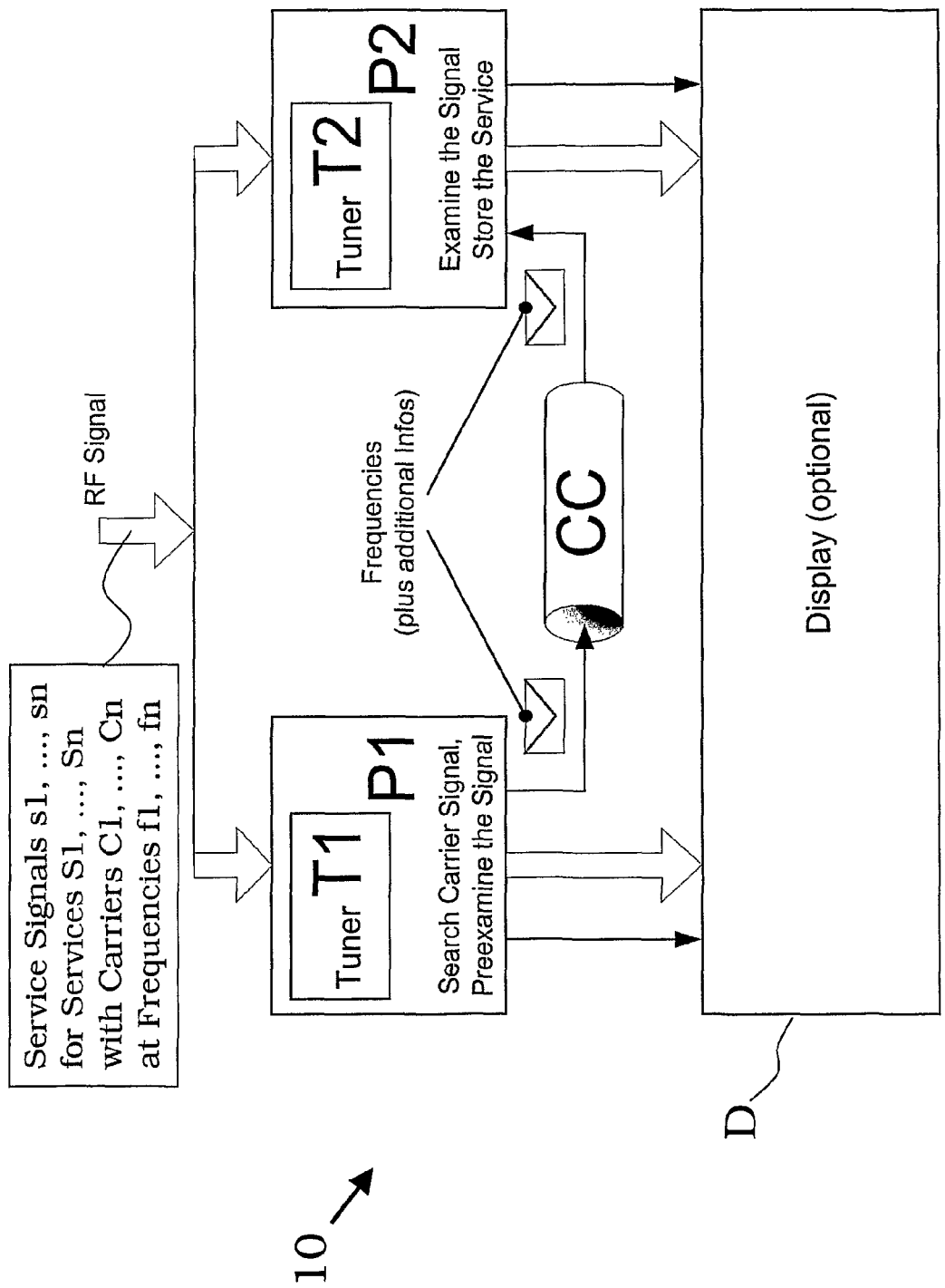
FIG. 1 is a schematical block diagram elucidating details of a first preferred embodiment of the inventive method for tuning a system and of a respective inventive tuning apparatus itself.

According to the present invention a signal is received which might by a radio frequency signal or RF signal. Said received signal may comprise service signals S1, . . . , Sn for possible or potential services s1, . . . , sn. Said service signals s1, . . . , sn possess some carrier C1, . . . , Cn at given frequencies f1, . . . , fn.

As can be seen from FIG. 1 according to a first tuning process P1 performed in a first tuning device T1 the received RF signal is searched for said service signals s1, . . . , sn by sweeping a search frequency fs starting from a starting frequency f0 and incrementing the search frequency fs. If a carrier cj at a given frequency fj is found a communication channel CC from the first tuning process P1 or the first tuning device P2 to the second tuning process P2 or the second tuning device T2 is opened in order to communication the found frequencies fj and—if any—some further identification information from the found service signals sj and the respective service sj and carrier cj from said first tuning process P1 or first tuner T1 to the second tuning process P2 and tuning device T2. After the frequencies fj have been communicated by said first tuning process P1 and said first tuning device T1 and have been received by said second tuning process P2 and said second tuning device T2, the second tuning process P2 and second tuning device T2 registers the respective found services Sj with the respective carrier Cj at the given frequency fj of the received service signal sj contained in said received radio frequency signal by further investigating the same thereby generating some information data which are useful and necessary for registering the respective service Sj to the system 10.

FIG. 2 explains in more detail the different aspects of the first and second tuning processes P1 and P2 and the respective capabilities of the corresponding tuning devices T1 and T2.

However, at this point the conventional tuning process is described first taking reference to FIG. 3.

The conventional tuning process is initialized and the analysis of a received radio frequency signal is started by setting a start frequency as a value for a search frequency fs in processing step 1. Then the frequency is increased according to processing step 2.

Increasing the frequency is done monotonically. Alternatively, the frequency may monotonically be decreased. Both frequency modification alternatives are meant simultaneously in the foregoing and in the following description.

After increasing/decreasing the frequency in step 2 it is checked in processing step 3 whether or not the increased/decreased frequency is still in the range of a loud processing or searching frequencies. If the increased frequency is out of range the tuning process is stopped and terminated. If the increased frequency value for the search frequency fs is not out of range the respective system is tuned to a respective possible service and processing step 4. In the following processing step 5 it is checked whether or not a service can be detected for the given said search frequency fs. If no service can be detected at the present said search frequency fs the processing is branched in the following processing steps 6 back to processing step 2 for further increasing the search frequency fs. If however in processing step 6 the service could be detected then the further search and increasing process for the search frequency fs is stopped. The most recent value for the search frequency fs is taken as an observation frequency fo in order to observe the detected service at the given observation frequency fo in processing step 7. Thereby extracting the necessary registering or information data ID which are then stored in a service data base in a following processing step 8 the termination of which refers back to a further increment of the search frequency fs, i.e. to processing step 2.

As can be seen from FIG. 3 the process of searching for the services which might be contained in the received radio frequency signal and tuning the system to the respective services is in each case of a detected service interrupted in order to further observe and analyse the found service. The search and tuning process is then continued after the most recent found service has been analysed and the respective information data ID have been stored to a service data base.

FIG. 2 demonstrates in contrast to the conventional processing the process structure of the inventive method for tuning a system.

First of all the first tuning process P1 performed by the first tuner device T1 begins by initializing the whole process and by setting the start frequency in a processing step 1a. Then in a following processing step 2a the start frequency is increased and used as a search frequency fs.

Again, increasing the frequency is done monotonically. Again alternatively, the frequency may monotonically be decreased. Both frequency modification alternatives are meant simultaneously in the foregoing and in the following description.

Then in a following processing step 3a it is checked on whether or not the increased/decreased search frequency fs is out of range. If the search frequency is out of range in a following step 4a a message is sent to the second tuning process P2 and the second tuning device T2 as an end message. Consequently in such a case both processes P1 and P2 are terminated. If the increased/decreased search frequency fs is not out of range a service is detected in a following processing step 5a within said first tuning process P1 within said first tuning device T1. If a service is not detected in a following step 6a the processing of said first tuning process is branched back to the processing step 2a of increasing the search frequency fs. If a service could be detected a processing step 7a follows in which the found frequency fj as a value of the search frequency fs and being connected to the service signal sj and the corresponding service sj is sent and communicated to the second tuning process P2 and the second tuning device T2. In contrast to the prior art immediately after having found the service sj and having communicated the respective frequency fj the search for further services is resumed and the processing is branched back to the processing step 2a for further increasing the search frequency fs. Therefore in contrast to prior art methods for tuning a system the search for services is more or less carried out without any interruption as the process for registering the respective service is executed in a outsourcing process, namely the second tuning process P2.

The second tuning process P2 starts with a first processing step 1b for receiving a respective message. This message could be—as described above—and end message when no frequency is submitted but could also be the message containing the frequency fj for a detected service sj which has been found by the first tuning process P1 performed in said first tuning device T1. After having received a frequency fj in a following step 3b the tuning frequency or observing frequency fo is set to said received frequency value fj. Then in a following processing step 4b the respective service sj corresponding to the service signal sj at the frequency fj is observed in order to extract from this observation respective information data ID. Said information data ID is then stored in a service data base in the following step 5b. After the information data ID have been stored in the service data base the processing of the second tuning process P2 is referred back to the step 1b of receiving a further message. Each received message stemming from processing step 1b is analyzed in a processing step 2b. If the received message in step 2b is an end message the processing of second tuning process P2 is terminated.

REFERENCE SYMBOLS

| | |
|---|---|
| 10 | system to be tuned |
| cj | carrier, carrier signal, j = 1, ..., n |
| D | display |
| fj | frequency, j = 1, ..., n |
| fo | observation frequency, tuning frequency |
| fs | search frequency |
| P1 | first tuning process |
| P2 | second tuning process |
| Sj | service, potential service, j = 1, ..., n |
| sj | service signal, potential service signal, j = 1, ..., n |
| T1 | first tuning device, first tuner |
| T2 | second tuning device, second tuner |

The invention claimed is:

1. A method for tuning a system of devices to a plurality of service signals of an according plurality of services, the method comprising:
   using and performing a first and a second tuning process are used and performed;
   wherein the first tuning process is adapted and performed to search for and find carrier signals of potential service signals and to determine frequencies of the potential service signals;
   wherein the second tuning process is adapted and performed to register the system to the services corresponding to the service signals based on the determined frequencies; and
   wherein after having found a service and after having communicated the respective frequency, the search for further services is resumed and processing is branched back to the search process with an increased search frequency.

2. A method according to claim 1, wherein the first tuning process is adapted to communicate the frequencies of found carrier signals of the potential service signals of the services, directly to the second tuning process.

3. A method according to claim 1, wherein the second tuning process is adapted to receive the found frequencies of found carrier signals of potential service signals of the potential services, directly from the first tuning process.

4. A method according to claim 1, wherein the first and the second tuning processes or parts thereof are performed parallely.

5. A method according to claim 1, wherein the first and the second tuning processes or parts thereof are performed consecutively.

6. A method according to claim 5, wherein each single determined frequency of found carrier signals of potential service signals of potential services is provided to the second tuning process immediately after the respective frequency has been determined.

7. A method according to claim 5, wherein determined frequencies of found carrier signals of potential service signals of potential services are provided to the second tuning process in a group-wise manner each group including of a sub-set of the determined frequencies.

8. A method according to claim 5, wherein determined frequencies of found carrier signals of potential service signals of potential services are provided to the second tuning process in its entirety at a given instant of time after the plurality of frequencies has been determined in its entirety.

9. A method according to claim 1, wherein the first tuning process comprises:
   setting a start frequency as a value for a search frequency,
   increasing a value of the search frequency, and
   detecting for each value of the search frequency a possible service or service signal.

10. A method according to claim 1, wherein said second tuning process comprises:
    receiving a value of a frequency of a service or a service signal,
    setting for each received value of a frequency an observation frequency to the respective received frequency,
    observing the respective services or the respective service signal at the observation frequency,
    extracting information data from the observed service or the observed service signal, and
    storing the information data.

11. A method according to claim 1, wherein a first tuning device is used to perform the first tuning process, and wherein a second tuning device is used to perform the second tuning process.

12. An apparatus, adapted and arranged and which comprises means for carrying out a method for tuning a system according to claim 1 and steps thereof.

13. An apparatus according to claim 12, which comprises application specific integrated circuit means for carrying out the method for tuning a system according to claim 1 and steps thereof.

14. A non-transitory computer readable medium, comprising instructions that when executed by a computer or digital signal processor realize a method for tuning a system according to claim 1.

* * * * *